(12) United States Patent
Roth et al.

(10) Patent No.: US 12,379,419 B2
(45) Date of Patent: Aug. 5, 2025

(54) DEVICE FOR MEASURING CELL VOLTAGES IN A MODULE

(71) Applicant: ELRINGKLINGER AG, Dettingen/Erms (DE)

(72) Inventors: Heinrich Roth, Dettingen/Erms (DE); Thomas Sträussl, Dettingen/Erms (DE); Florian Schwarz, Dettingen/Erms (DE)

(73) Assignee: ELRINGKLINGER AG, Dettingen/Erms (DE)

( * ) Notice: Subject to any disclaimer, the term of this patent is extended or adjusted under 35 U.S.C. 154(b) by 211 days.

(21) Appl. No.: 18/252,581

(22) PCT Filed: Nov. 5, 2021

(86) PCT No.: PCT/EP2021/080770
§ 371 (c)(1),
(2) Date: May 11, 2023

(87) PCT Pub. No.: WO2022/101101
PCT Pub. Date: May 19, 2022

(65) Prior Publication Data
US 2024/0003982 A1 Jan. 4, 2024

(30) Foreign Application Priority Data

Nov. 11, 2020 (DE) .......................... 102020129780.7

(51) Int. Cl.
| | | |
|---|---|---|
| *G01R 31/3835* | (2019.01) | |
| *H01M 10/653* | (2014.01) | |
| *H01M 50/213* | (2021.01) | |
| *H01M 50/503* | (2021.01) | |
| *H01M 50/512* | (2021.01) | |
| *H01M 50/514* | (2021.01) | |

(Continued)

(52) U.S. Cl.
CPC ...... *G01R 31/3835* (2019.01); *H01M 10/653* (2015.04); *H01M 50/213* (2021.01); *H01M 50/503* (2021.01); *H01M 50/512* (2021.01); *H01M 50/514* (2021.01); *H01M 50/522* (2021.01); *H01M 50/569* (2021.01)

(58) Field of Classification Search
CPC ............ G01R 31/3835; H01M 10/653; H01M 50/213; H01M 50/503; H01M 50/512; H01M 50/514; H01M 50/522; H01M 50/569; H01M 50/204; H01M 50/502; H01M 10/482
USPC ......................................................... 324/434
See application file for complete search history.

(56) References Cited

U.S. PATENT DOCUMENTS 10,454,282 B2   10/2019   Cheon et al.
2014/0154539 A1* 6/2014   Kwok ................. H01M 50/244
                                                                      429/82

(Continued)

FOREIGN PATENT DOCUMENTS

WO   WO-2020143375 A1 *  7/2020  ............ H01M 50/20

*Primary Examiner* — Christopher P McAndrew

(57) ABSTRACT

A device for measuring cell voltages in a module that is composed of a plurality of individual cells inside a rechargeable battery. In order to create a device of the above-mentioned kind with reduced production complexity, the invention proposes measuring devices for voltage measurement via a housing of a respective cell to be electrically connected to a busbar.

12 Claims, 5 Drawing Sheets

(51) Int. Cl.
*H01M 50/522* (2021.01)
*H01M 50/569* (2021.01)

(56) References Cited

U.S. PATENT DOCUMENTS

| | | | |
|---|---|---|---|
| 2015/0072209 A1* | 3/2015 | Tyler | B60L 50/16 |
| | | | 429/159 |
| 2016/0372801 A1* | 12/2016 | Clemente | H01M 50/264 |
| 2017/0018750 A1* | 1/2017 | Winter | H01M 50/522 |
| 2017/0025717 A1 | 1/2017 | Zeller et al. | |
| 2017/0187011 A1 | 6/2017 | Cho | |
| 2017/0264107 A1* | 9/2017 | Cheon | H02J 7/0068 |
| 2020/0014006 A1* | 1/2020 | Oliveira | H01M 10/625 |
| 2020/0259157 A1* | 8/2020 | Motohashi | H01M 50/227 |
| 2021/0083248 A1* | 3/2021 | Krämer | H01M 50/522 |
| 2021/0313649 A1* | 10/2021 | Alisic | H01M 10/0525 |
| 2021/0408514 A1* | 12/2021 | Sohag | H01M 10/613 |

* cited by examiner

DEVICE FOR MEASURING CELL VOLTAGES IN A MODULE

FIELD OF THE INVENTION

The present invention relates to a device for measuring cell voltages in a module of a battery device.

DESCRIPTION OF THE PRIOR ART

It is known from the prior art that a module inside a rechargeable battery consists of a plurality of individual cells. There are various known approaches to designing devices for measuring voltage in cells of such a module. These devices, however, provide a voltage measurement that takes place at a top end of the cells that is usually freely accessible by and large. This measurement principle thus requires an electrical connection between cell poles and—generally in the case of round cells—a so-called busbar whose main function is power transmission. It is simultaneously used for a voltage measurement. This design generally requires at least one additional component in the form of a contacting system. The busbar is integrated into the contacting system in order to produce the connection of the individual cells for a voltage measurement. This approach has, among other things, the disadvantages of requiring additional components and space. Additional assembly steps entail both prolonged processing times and increased overall processing costs. This results in an overall higher part price for a relevant module.

Frequently, however, the voltages are not measured at elementary individual cells. Since these elementary individual cells are respectively interconnected in a parallel connection to form logical cells, instead of individual measurements, a voltage of such a logical cell is monitored. This does in fact decrease the number of voltage measurements within a module, but the above-indicated problems basically remain unsolved.

The object of the present invention is to create a device of the above-mentioned type with reduced production complexity.

SUMMARY OF THE INVENTION

This object is attained according to the invention in that the device for measuring voltage is electrically connected to a busbar via a housing of a respective cell. Instead of additional connections and/or conductors, a housing of a relevant cell itself is thus used as a second connection for voltage measurement, which is accomplished by means of a busbar. The busbar only has to be electrically designed only with a view to the requirements of the respective measuring device since the ability to conduct small currents is all that is required.

Thus, the cell housings have an electrical connection to a respective busbar, wherein a busbar respectively forms a logical cell through a parallel connection of a certain number of elementary cells and the busbar is connected to a means for measuring potential differences between adjacent logical cells. By contrast with the prior-art concepts of a voltage measurement that is connected via a cell housing, which is implemented for example through the cell base or sides of the relevant cell housing, according to this embodiment of the invention, a logical cell consisting of a plurality of individual elementary cells combines a voltage measurement with a minimal complexity and a comparatively low space requirement. Particularly with an arrangement in which the individual cells of a logical cell can no longer be arranged linearly in a row, this approach is very advantageous in comparison to known interconnected arrangements, as explained in greater detail below based on an example shown in the drawings. The busbar in this case is connected to a means for measuring potential differences e.g. between adjacent cell rows or successive logical cells. At the same time, each measurement is electrically and thermally decoupled as much as possible from larger current flows.

In a particularly advantageous modification of the invention, each cell in a lower array is mechanically fixed in a through opening. This achieves a reliable and easily produced electrical connection of a busbar to a respective cell housing on a respective cell bottom of the cell housing by means of an electrically conductive connection.

This electrically conductive connection is advantageously implemented in the form of an electrically conductive glue or conductive adhesive together with the mechanical fixing of the cell housing and preferably also of the busbar in the array. A region around the busbar and its attachment to the cell housing is surrounded by a thermally conductive adhesive. Advantageously, the thermally conductive adhesive is embodied to additionally extract heat from the cell by coupling it to a heat sink of the battery module.

In a significant modification of the invention, an electrically conductive connection is alternatively or additionally implemented by means of an elastic mechanical connection such as a spring contact. The cell housings therefore have mechanical tolerance-compensating electrical connections to a respective shared busbar for voltage measurement.

Advantageously, a cell in an upper array opposite from the lower array is held in a conically tapering recess. In this case, the recess has a shoulder against which the cell housing is fixed in clamping fashion. After an assembly of the relevant module, the two arrays are mechanically fixed relative to each other so that the individual cells contained therein are secured in position relative to one another.

In a particularly preferred embodiment of the invention, a logical cell is formed by a parallel connection of elementary cells and in this case, comprises more or fewer elementary cells than are arranged in one row or column of a respective module. With a low wiring complexity, this significantly facilitates an optimum use of space inside a housing of a respective module. By using other technical features mentioned above, it is thus possible to implement a voltage monitoring with minimized complexity.

Advantageously, a busbar is embodied as a flat stamped part or a flat stamped-and-bent part made of a metallic sheet. The busbar is therefore an easily producible and flexibly adaptable as well as formable individual part. In one modification, the busbar has at least one branch. This simple feature makes it possible in particular to produce a logical cell in a parallel connection, which comprises more or fewer elementary cells than are arranged in one row or a column of a respective module.

BRIEF DESCRIPTION OF THE DRAWINGS

Other features and advantages of embodiments according to the invention will be explained in greater detail below with reference to exemplary embodiments in the drawings. In the schematic depictions therein.

DETAILED DESCRIPTION OF THE PREFERRED EMBODIMENTS

Figure 1:
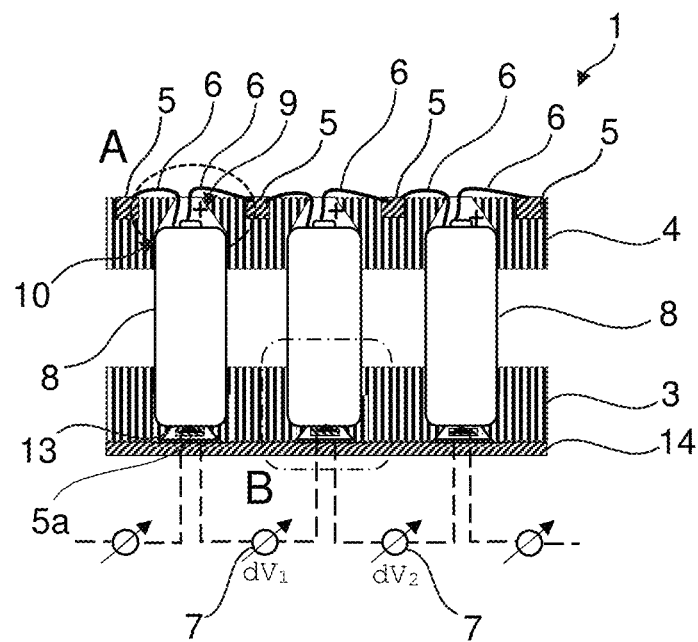
FIG. 1: shows a side view of a detail of a battery module according to a first exemplary embodiment.

The same reference numerals are consistently used for the same elements or method steps throughout the various drawings. Without limiting the invention, the only thing presented and described below is a use of exemplary embodiments of the invention using cylindrical cells in a battery module for electrically driven vehicles. It is clear to the person skilled in the art, though, that it is equally possible for the concept to be adapted to stationary applications in electrical energy storage for renewable energy producers on the one hand, and to portable battery modules on the other, e.g. for electrically driven tools. A teaching according to the invention can also be transferred to other cell designs.

Figure 5:
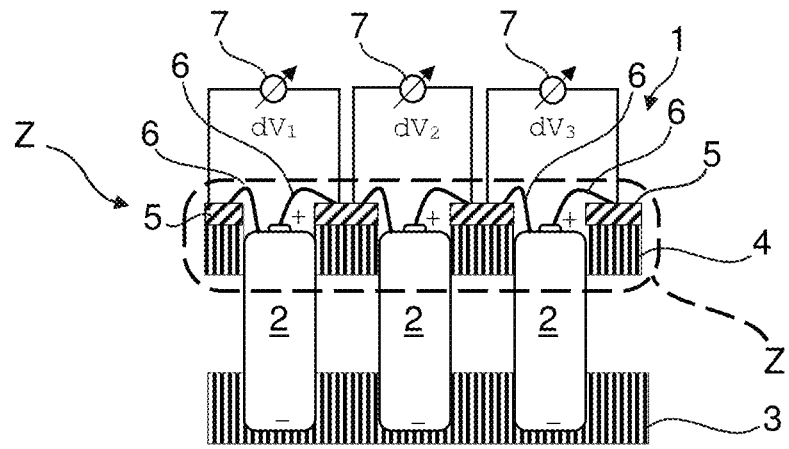
FIG. 5: shows a side view of a detail of a battery module that is known from the prior art.

FIG. 5 shows a side view of a detail of a battery module 1 that is known from the prior art, which has a number of cylindrical cells 2. These cells 2 are arranged as a matrix in the installation position shown, are held in a lower region so that they are insulated relative to one another in recesses in a lower array 3 composed of an insulating plastic, and are fixed in an upper region in an upper array 4 made of an electrically non-conductive plastic. The cells 2 have both of the electrical poles in their upper region. A voltage and a maximum current of the battery module 1 are established by means of a corresponding electrical interconnection of the poles of the cells 2. Between the columns of cells 2, busbars 5 are positioned on the upper array 4. The busbars 5 electrically connect the cells 2 in series in order to transmit power via bonded connectors 6 in the direction of a row Z of cells 2. In addition, the busbars 5 are used on the one hand for an interconnection of the cells 2 in a parallel connection in such a way that they form shared connection surfaces for bonded connectors 6 of one column of cells 2 as a logical cell and on the other hand, the busbars 5 produce measurement pickups or connections for the measuring device 7 for measuring the respective potential differences or voltages $dV_1$, $dV_2$, $dV_3$, etc. between the columns of cells 2 of the battery module 1.

The voltage measurement and the interconnection are carried out at the poles at the top end of the cells 2. This measurement principle requires an electrical connection between the cell poles and—at least in the case of round cells—a busbar 5. A main function of the busbar 5 here is the current measurement. As a result, at least the busbar 5 is generally required as an additional component, which is needed for respectively contacting the poles of each cell 2 as part of the overall system for an interconnection and also for the voltage measurement.

Figure 6:
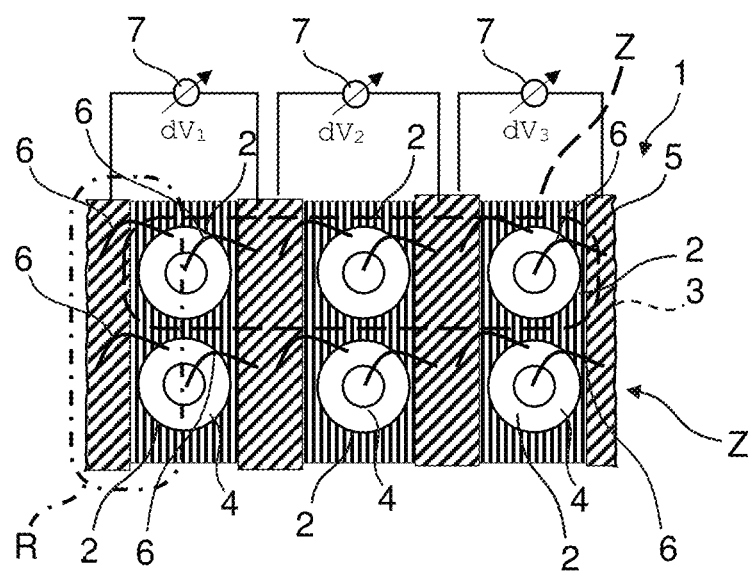
FIG. 6: shows a top view of the detail from FIG. 5.

FIG. 6 shows a top view of the detail from FIG. 5. This depiction shows how the cells 2 are positioned in parallel rows and are electrically connected in series to cells 2 from other rows via an adjoining busbar 5. The busbars 5 are also connected in pairs to measuring devices 7 for measuring partial voltages $dV_i$ between adjacent busbars 5, as already indicated in FIG. 5. In prior-art concepts, the voltage measurement therefore takes place at a top end of the cells. This requires an electrical connection between cell poles and in this case where round cells are used, requires a busbar 5 whose additional function is the voltage measurement. This generally requires an additional component, the cell contacting system into which the busbar 5 is integrated, in order on the one hand to implement the connection of the individual cells 2 and on the other, to implement a respective voltage measurement. There are thus the disadvantages that, among other things, additional components and space are required in the region of the upper array 4, which entails additional assembly steps and increased processing times as well as additional processing costs. This results in a higher part price for the relevant module. Furthermore, this approach is very inflexible with regard to a free arrangement of elementary cells, as illustrated once again below based on an example with improved use of space. A measurement of partial voltages $dV_i$ takes place at conductors that sometimes have very powerful currents flowing through them and are intensely heated by their own ohmic losses. This results in a distortion of measurement results.

The depiction in FIG. 1 shows a side view of a detail from a battery module according to a first exemplary embodiment analogous to the depiction in FIG. 5. Means 7 for measuring potential differences $dV_i$ between adjacent cell rows or for voltage measurement in this case—by contrast with the prior-art concept described above by way of example in connection with FIG. 5—are now connected directly via a respective cell housing 8, which is implemented here, for example, via a cell bottom or sides of the relevant housing 8 of a cell 2 by means of busbars 5a. The cell housings 8 have an electrical connection to a busbar 5a, which is in turn connected to the means 7 for measuring potential differences between adjacent cell rows. All of the elementary cells 2 that are respectively connected to a shared busbar 5a for voltage measurement form a so-called logical cell L. This electrical connection of the voltage measurement means 7 to a busbar 5a thus directly achieves savings in terms of components, development effort, production steps, and installation space.

Figure 2A:
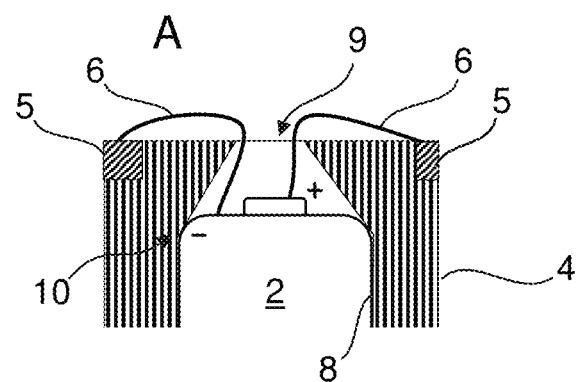
FIGS. 2*a* and 2*b*: show enlarged details of FIG. 1.
Figure 2B:
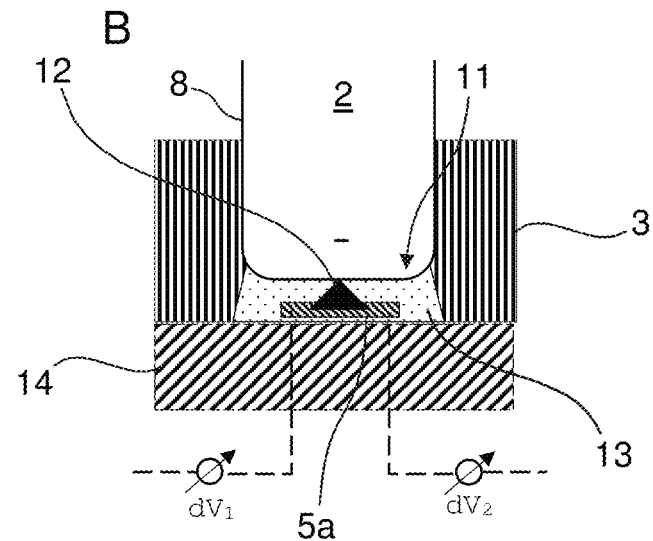

The depictions in FIGS. 2a and 2b are enlarged details A and B from FIG. 1. In an enlarged detail, FIG. 2a shows how a cell 2 is now held in the upper array 4. Instead of a cylindrical recess, the upper array 4 now has a conically tapering recess 9 with a shoulder 10 against which the cell housing 8 is fixed in clamping fashion. In comparison to the design in FIG. 5, the busbar 5 is now used only for producing an interconnection of the cells 2 by means of bonded connectors 6 and can thus be of smaller dimensions.

Detail B from FIG. 2b shows a fixing of the cell 2 in the lower array 3. By contrast with the prior art according to FIG. 5, the cell 2 is now also fixed in a through opening 11 in the lower array 3. In the present exemplary embodiment, a reliable and easily produced electrical connection of the busbar 5a to a respective cell housing 8 is implemented at a respective cell bottom of the cell housing 8 by means of an electrically conductive connection 12 in the form of an electrically conductive adhesive or conductive glue. Alternatively or in addition, this connection is implemented by means of an elastic mechanical connection such as a spring contact. The region around the busbar 5a and its connection to the cell housing 8 is surrounded by a thermally conductive adhesive 13. This adhesive 13 also fixes the cell 2 in the through opening 11 of the lower array 3. In addition, due to its thermal conductivity, the adhesive 13 also extracts heat from the cell 2 by coupling to a heat sink 14 of the battery module 1.

Figure 3:
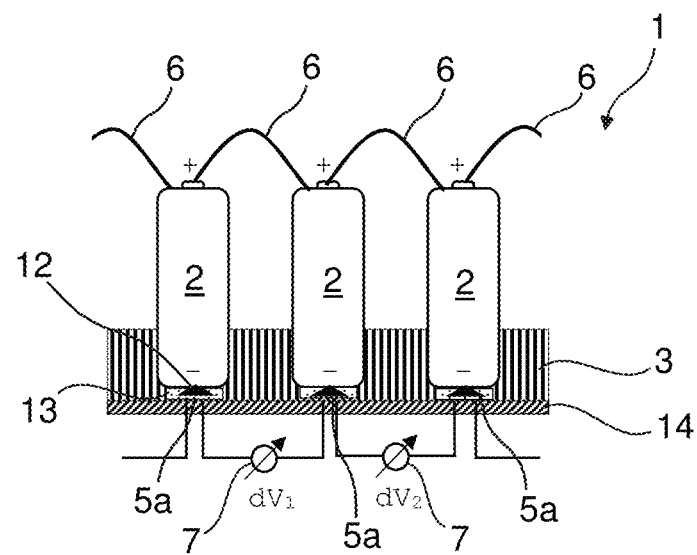
FIG. 3: shows a side view of a detail of a battery module according to a second exemplary embodiment.

The additional busbars 5 in an upper array 4 that are shown in FIGS. 1 and 2a can be eliminated by means of correspondingly adapted bonded connectors 6 since the busbars 5a are used for the voltage measurement in each logical cell L. FIG. 3 is a side view of a detail of a battery module 1 according to a corresponding second exemplary embodiment. The busbars 5a in this case are once again used for producing an electrical parallel interconnection of the cells 2 to form logical cells L and at the same time, are used for producing a connection of the measuring devices 7 for measuring partial voltages $dV_i$.

In this design, a fixing produced by means of the lower plastic array 3 according to the above description is sufficient. It is thus possible to also eliminate the upper array 4. In order to compensate for tolerances and thermal expansions, bonded connectors 6 are now routed in arcs from a plus pole of a cell 2 directly to a cell housing 8 of a respectively adjacent cell 2 and are affixed thereto in an electrically conductive fashion, which significantly simplifies the design and achieves savings in terms of components, required space, and weight.

Figure 4:
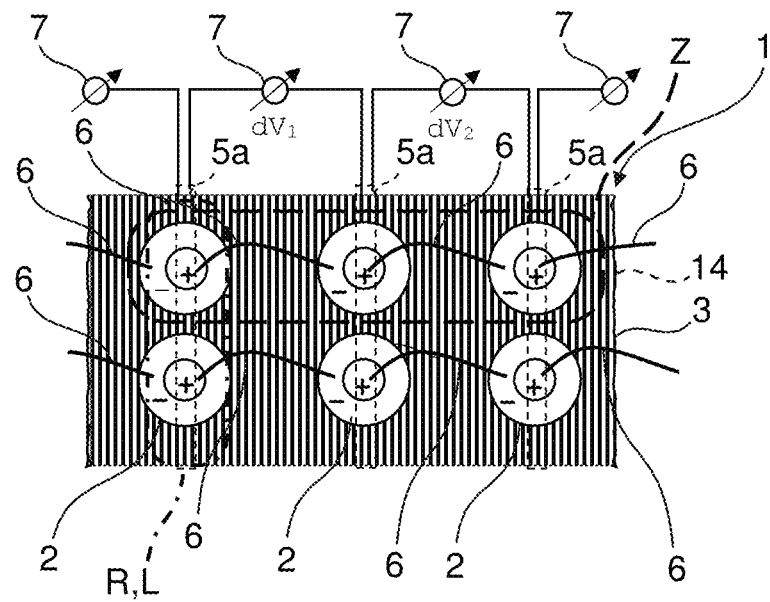
FIG. 4: shows a top view of the exemplary embodiment according to FIG. 3.

FIG. 4 shows a top view of the exemplary embodiment according to FIG. 3. Viewed from above, the series connection of the cells 2 by means of bonded connectors 6 is visible while a parallel interconnection beneath the lower plastic array 3 is produced by the busbars 5a. In this case, the busbars 5a once again serve as feeders to the measuring devices 7 for measuring partial voltages $dV_i$ between adjacent rows of cells 2 and define logical cells L as rows R.

Figure 7:
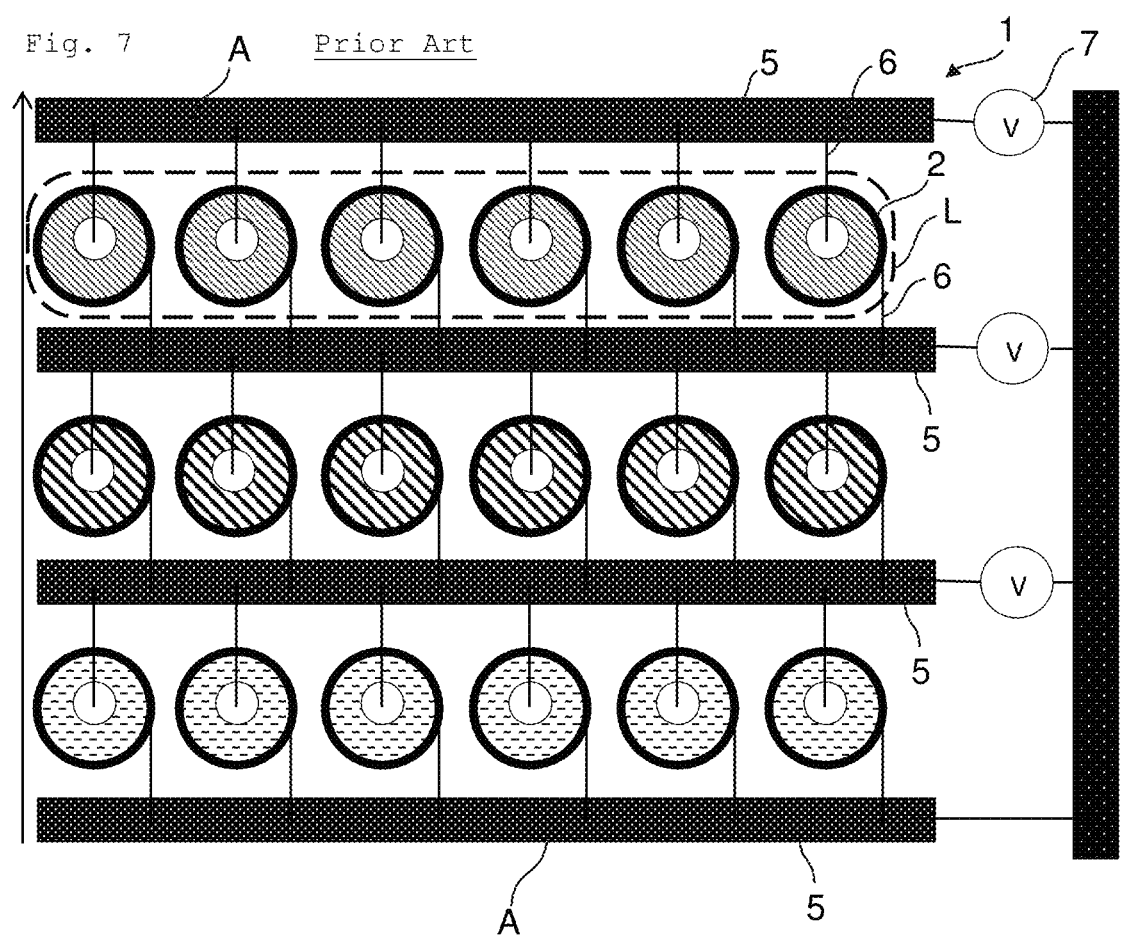
FIG. 7: shows a module according to the prior art with a series connection of three logical cells, which are produced through parallel connection of 6 respective elementary cells.

FIG. 7 shows a detail from a module, which is composed according to the prior art of 18 cells 2 that are made up of a series connection of three logical cells L, which are composed of a parallel connection of six elementary cells 2 each, as shown in FIGS. 5 and 6 and described above. An interconnection of the elementary cells 2 here thus provides a placement between and connection to busbars 5. The pickups for the voltage monitoring of each logical cell L are located on the busbars 5. Three parallel rows are thus provided in the module 1, whose elementary cells 2 are respectively connected to one another in a parallel connection to form a logical cell L between adjacent busbars 5. If one of the logical cells L does not supply a predefined voltage, then this fault is clearly detectable not only between external contacts A, but also at least at the level of the logical cells L.

Figure 8:
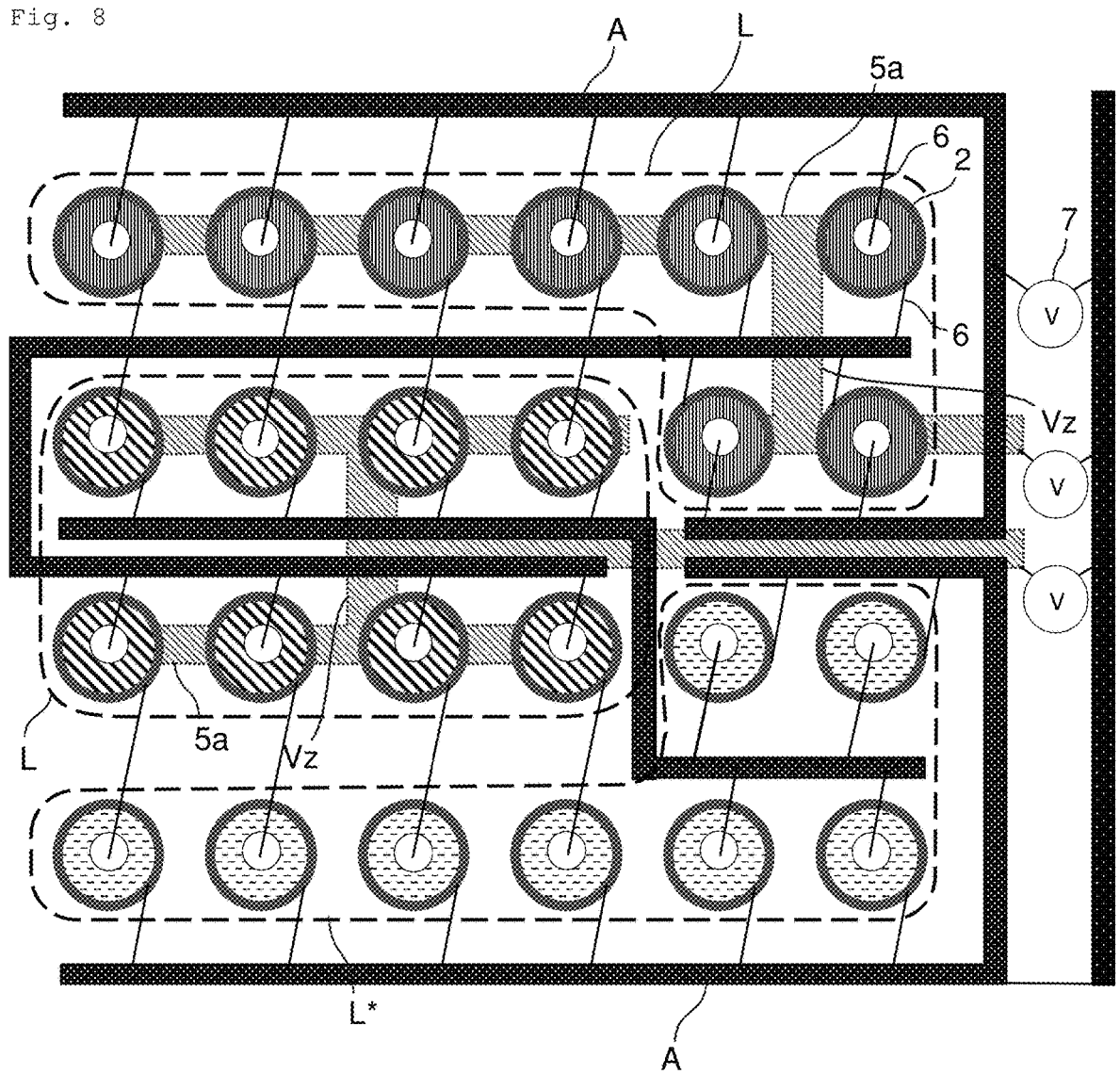
FIG. 8: shows a detail of a module, which—likewise having an interconnection of the elementary cells according to a first embodiment of the present invention—has three logical cells composed of eight elementary cells each arranged in four rows and a monitoring of the voltages of each of the logical cells.

Building on the depiction in FIG. 7, FIG. 8 now shows a significant advantage of an interconnection according to the invention. For this purpose, FIG. 8 shows a module 1 with two external connections A that has an interconnection of the elementary cells 2 according to the embodiment of the present invention outlined in FIGS. 3 and 4. In this case, three logical cells L are now each composed of eight elementary cells 2. These elementary cells 2, however, are arranged in four rows inside this module 1. An individual logical cell L therefore comprises more elementary cells 2 than are provided in one row of this module 1. The busbars 5a in this case are once again embodied as flat stamped parts made of a metallic sheet, in this case a thin copper sheet. The busbars 5a in this case, have at least one branch Vz among other things. In this example, only a first logical cell L* can constitute an exception to a certain degree since in this case, an external contact A can be used as a busbar 5a.

By using embodiments of the present invention, it is therefore easily possible by means of busbars 5a for logical cells L to comprise more or fewer elementary cells 2 than are arranged in one row of a respective module 1. For example, a depicted arrangement of logical cells L can in practice be necessary in order achieve an optimum use of space in a housing of a battery module 1. Also in the exemplary embodiment in FIG. 8, the module 1 has a monitoring of the voltages of each of the logical cells L via busbars 5a by devices for measuring 7 partial voltages $dV_i$, which would be difficult or impossible to achieve in known arrangements according to FIGS. 5 to 7. Despite this new flexibility in the design of a module 1 with optimized use of space, throughout all of the exemplary embodiments, a complexity of the bonded connectors 6 still corresponds essentially to that of known module arrangements.

The invention claimed is:

1. A rechargeable battery module for an electrically driven vehicle, wherein said battery module is composed of a plurality of individual cells, and the cells are all arranged in the same orientation in the battery module, and
the cells have two electrical poles at their upper region and a voltage and a maximum current of the battery module are set by a corresponding electrical connection of the two electrical poles of the cells, and
the battery module has a device for measuring cell voltages, wherein the device comprises a plurality of measuring devices for voltage measurement via a busbar connected to a housing of a respective cell of the plurality of individual cells, and the plurality of measuring devices are electrically connected to the busbar.

2. The battery module according to claim 1, wherein the cell housings of the plurality of individual cells have an electrical connection to a respective busbar, wherein the busbar respectively forms a logical cell by producing a parallel connection of a certain number of elementary cells and the busbar is connected to a device for measuring potential differences between adjacent logical cells.

3. The battery module according to claim 1, wherein each of the plurality of individual cells in a lower array is fixed in a through opening, wherein a reliable and easily produced electrical connection of the busbar to a respective cell housing on a respective cell bottom of the cell housing is implemented by an electrically conductive connection.

4. The battery module according to claim 1, wherein a region around the busbar and an attachment of the busbar to the cell housing is surrounded by a thermally conductive glue or conductive adhesive.

5. The battery module according to claim 4, wherein the thermally conductive adhesive is embodied to additionally extract heat from the cell by coupling the cell to a heat sink of the battery module.

6. The battery module according to claim 5, wherein an electrically conductive connection between the busbar and the cell housing is alternatively or additionally implemented by an elastic mechanical connection.

7. The battery module according to claim 1, wherein at least one of the plurality of individual cells in an upper array is held in a conically tapering recess, wherein the recess has a shoulder (10) against which the cell housing is fixed in clamping fashion.

8. The battery module according to claim 1, wherein a logical cell, which is formed by a parallel connection of a plurality of elementary cells connected by the busbar, comprises more or fewer elementary cells than are arranged in one row or column of a respective module.

9. The battery module according to claim 1, wherein the busbar is embodied as a flat stamped part or as a flat stamped-and-bent part made of a metallic sheet.

10. The battery module according to claim 1, wherein the busbar has a branch.

11. The battery module according to claim 6, wherein the elastic mechanical connection is a spring contact.

12. The battery module according to claim 1, wherein individual elementary cells are connected to one another in series at an upper area of each of the elementary cells.

* * * * *